US008074517B2

(12) United States Patent
Uemura

(10) Patent No.: US 8,074,517 B2
(45) Date of Patent: Dec. 13, 2011

(54) INERTIA FORCE SENSOR

(75) Inventor: Takeshi Uemura, Osaka (JP)

(73) Assignee: Panasonic Corporation, Osaka (JP)

( * ) Notice: Subject to any disclaimer, the term of this patent is extended or adjusted under 35 U.S.C. 154(b) by 389 days.

(21) Appl. No.: 12/376,985

(22) PCT Filed: Sep. 18, 2007

(86) PCT No.: PCT/JP2007/068035
§ 371 (c)(1),
(2), (4) Date: Feb. 10, 2009

(87) PCT Pub. No.: WO2008/035649
PCT Pub. Date: Mar. 27, 2008

(65) Prior Publication Data
US 2010/0199761 A1 Aug. 12, 2010

(30) Foreign Application Priority Data
Sep. 22, 2006 (JP) ................................ 2006-256654

(51) Int. Cl.
*G01P 9/00* (2006.01)
(52) U.S. Cl. .................................................. 73/504.12
(58) Field of Classification Search ............... 73/504.04, 73/504.12, 514.01, 504.03, 504.08
See application file for complete search history.

(56) References Cited

U.S. PATENT DOCUMENTS

| 4,654,663 A * | 3/1987 | Alsenz et al. ............. 340/870.3 |
| 2009/0183568 A1* | 7/2009 | Yamanaka et al. ......... 73/504.04 |
| 2010/0126270 A1* | 5/2010 | Terada et al. .............. 73/504.12 |

FOREIGN PATENT DOCUMENTS

| JP | 10-170279 A | 6/1998 |
| JP | 2000-131077 A | 5/2000 |
| JP | 2005-249395 A | 9/2005 |
| JP | 2005-249646 A | 9/2005 |

OTHER PUBLICATIONS

International Search Report for PCT/JP2007/068035.

* cited by examiner

*Primary Examiner* — Jewel V Thompson
(74) *Attorney, Agent, or Firm* — Pearne & Gordon LLP

(57) ABSTRACT

When detecting an angular rate in a detecting element (1), when an angular rate occurs, it is detected on the basis of a first sum by adding output values issued from upper electrode of second sensing electrode part (19*b*) and upper electrode of fourth sensing electrode part (20*b*) both in positive polarity, a second sum by adding output values issued from upper electrode of first sensing electrode part (19*a*) and upper electrode of third sensing electrode part (20*a*) both in negative polarity, a third sum by adding output values issued from lower electrode of first sensing electrode part (19*a*) and lower electrode of third sensing electrode part (20*a*) both in positive polarity, and a fourth sum by adding output values issued from lower electrode of second sensing electrode part (19*b*) and lower electrode of fourth sensing electrode part (20*b*) both in negative polarity. In this configuration, the inertial force sensor enhanced in detection sensitivity is presented.

8 Claims, 6 Drawing Sheets

INERTIA FORCE SENSOR

TECHNICAL FIELD

The present invention relates to an inertial force sensor for detecting the inertial force used in various electronic appliances for position control or navigation of mobile structures such as aircraft, automobile, robot, vessel and vehicle.

BACKGROUND ART

A conventional inertial force sensor is explained below. The inertial force sensor includes an angular rate sensor and an acceleration sensor. Generally, the angular rate sensor has a detecting element in various shapes, such as tuning fork shape, H-shape, T-shape and others, and by vibrating the detecting element, the strain of the detecting element accompanied by generation of Coriolis force is sensed electrically, and the angular rate is detected. The acceleration sensor has a detecting element having a weight, and the strain of the detecting element due to move of the weight is sensed electrically, and the acceleration is detected. To sense the strain, for example, a sensing electrode part consisting of upper electrode and lower electrode with an intervening piezoelectric element is disposed in the detecting element, and the angular rate or acceleration is detected on the basis of the current flowing out from the sensing electrode part accompanied by strain of the detecting element.

A plurality of inertial force sensors such as angular rate sensors or acceleration sensors are used in the position control device or navigation device of mobile structure such as vehicle, being disposed corresponding to the inertial force to be detected or the axis of detection. A prior art relating to the present invention is disclosed, for example, in patent document 1. In the conventional inertial force sensor, the strain of the detecting element is very slight when detecting the angular rate or acceleration on the basis of the current flowing out from the sensing electrode part, and the output current from the sensing detecting part is also very small, and the detection sensitivity is low.

Patent document 1: Unexamined Japanese Patent Application Publication
No. 2005-249395

SUMMARY OF THE INVENTION

The present invention presents an inertial force sensor enhanced in the detection sensitivity. The sensing part of the present invention includes a sensing electrode part composed of an upper electrode and a lower electrode together with an intervening piezoelectric element, and the detecting circuit part is designed to detect the inertial force applied to an elastic element on the basis of the sum of the output value issued from the upper electrode of the sensing electrode part added to the output value issued from the lower electrode of the sensing electrode part. By this configuration, the inertial force applied to the elastic element is detected on the basis of the value of magnitude of nearly two times of the prior art by adding the output value issued from the upper electrode of the sensing electrode part and the output value issued from the lower electrode of the sensing electrode part, so that the detection sensitivity can be enhanced.

DESCRIPTION OF THE REFERENCE NUMERALS AND MARKS

Figure 1:
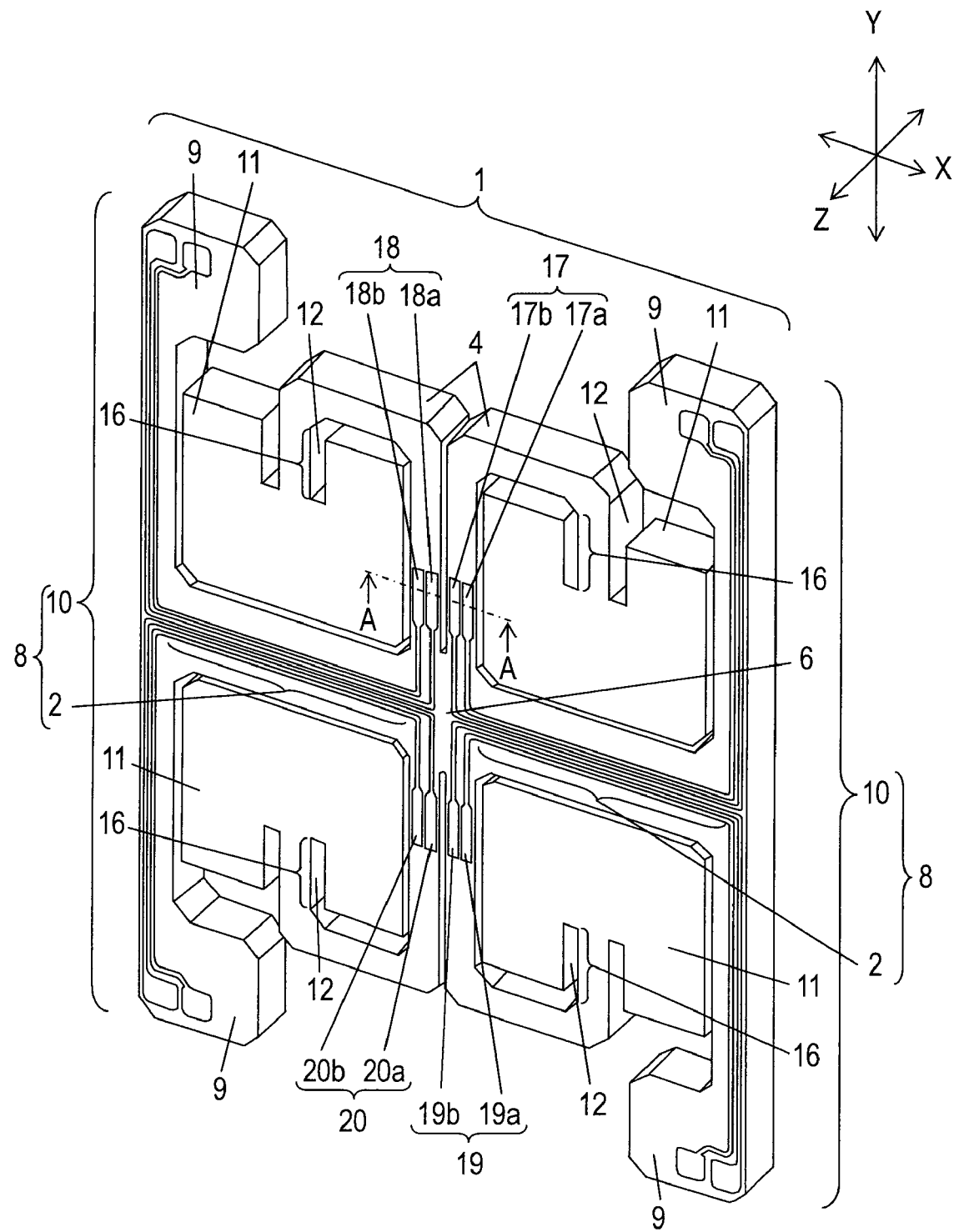
FIG. 1 is a perspective view of detecting element of angular rate sensor in a preferred embodiment of the present invention.

1 Detecting element
2 First arm
4 Second arm
6 Support part
8 Fixing arm
10 Third arm
11 Weight
12 Recess
13 Piezoelectric element
14 Lower electrode
15 Upper electrode
17 First driving part
17a First driving electrode part
17b Second driving electrode part
18 Second driving part
18a Third driving electrode part
18b Fourth driving electrode part
19 First sensing part
19a First sensing electrode part
19b Second sensing electrode part
20 Second sensing part
20a Third sensing electrode part
20b Fourth sensing electrode part

PREFERRED EMBODIMENTS FOR CARRYING OUT THE INVENTION

Preferred Embodiment 1

Figure 2:
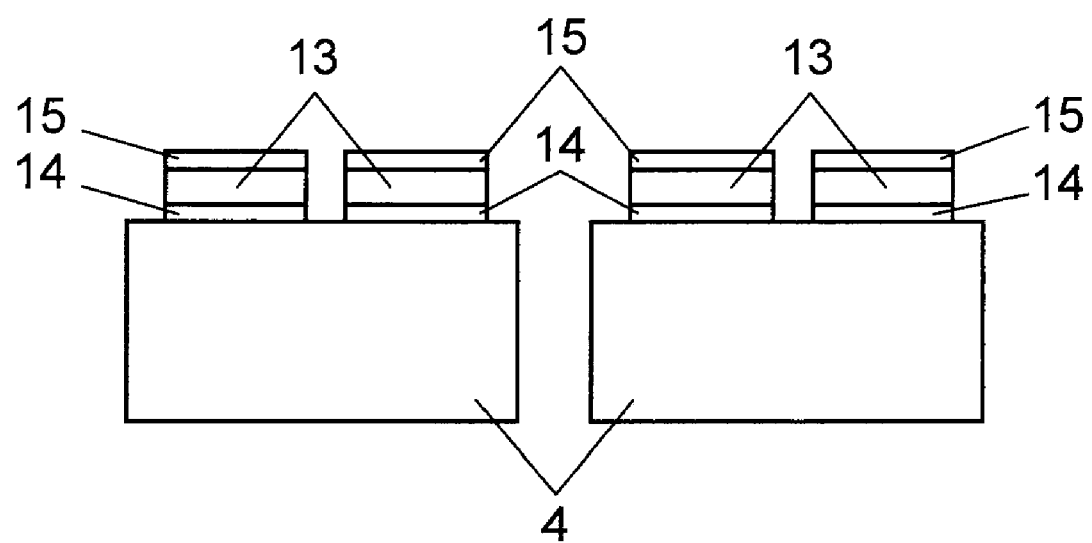
FIG. 2 is an A-A sectional view in FIG. 1.
Figure 3:
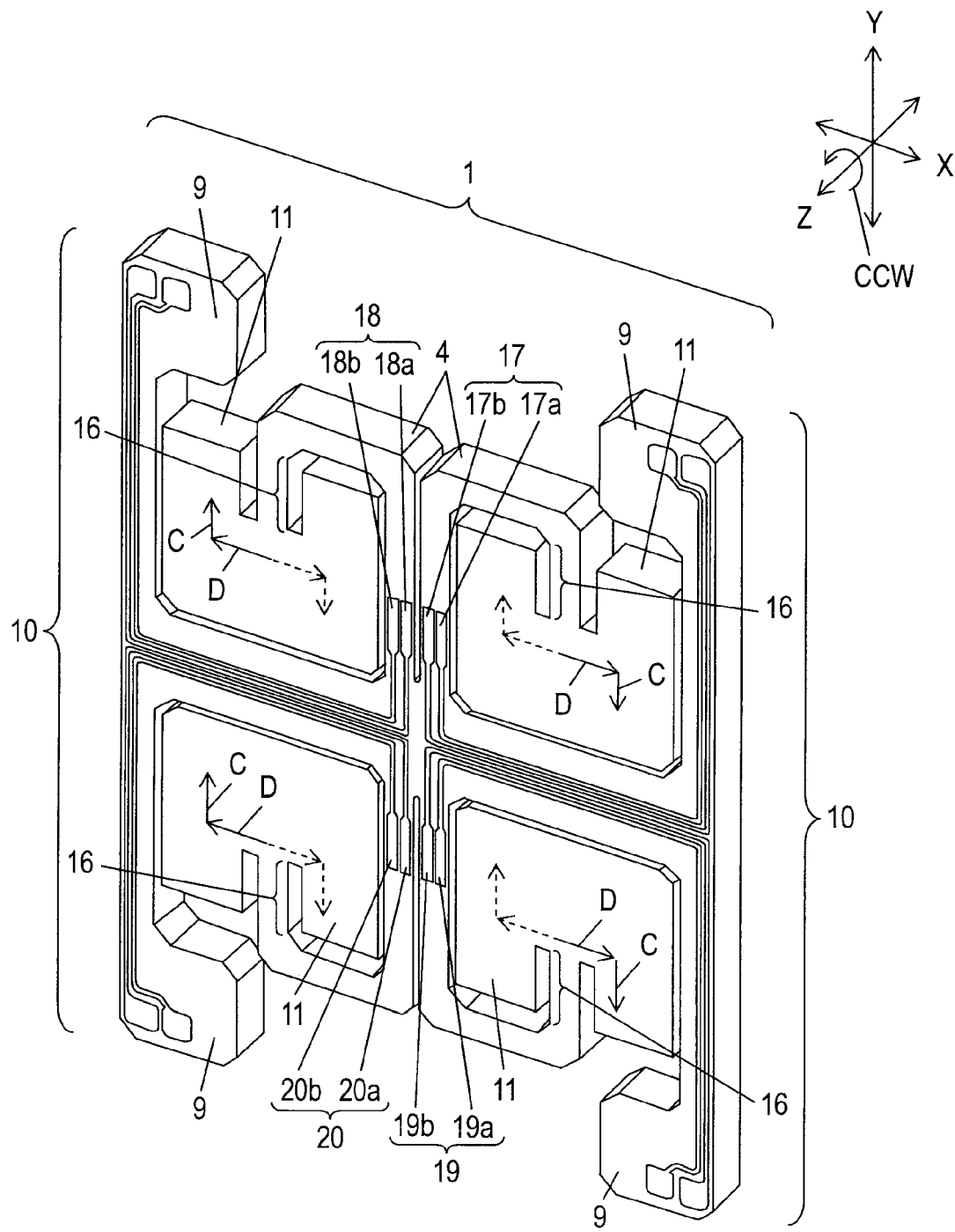
FIG. 3 is a motion state diagram of detecting element of angular rate sensor in the preferred embodiment of the present invention.

FIG. 1 is a perspective view of detecting element in a preferred embodiment of the present invention of an angular rate sensor as one of the inertial force sensors. FIG. 2 is an A-A sectional view in FIG. 1. FIG. 3 is a motion state diagram of the detecting element. The angular rate sensor has detecting element 1 composed of an elastic element for detecting an angular rate. In FIG. 1, this detecting element 1 has first arm 2 and second arm 4 formed orthogonally by coupling in orthogonal directions. It further includes support part 6 for coupling and supporting two first arms 2 and four second arms 4. Further, it includes third arm 10 vertically connected to first arm 2, and having its end part fixed to a mounting board (not shown). First arms 2 and third arm 10 are collectively called fixing arm 8. At this time, two first arms 2 and support part 6 are arranged nearly on a same straight line. As a variation of the shape, fixing parts 9 may be mutually coupled, and third arm 10 may be formed in a square frame shape.

Second arm 4 is provided with confronting part 16 bent at 180 degrees, and its leading end is coupled to weight 11. This weight 11 has recess 12.

Of the four second arms 4, the side of support part 6 of mutually facing two second arms 4 is provided with first driving part 17 and second driving part 18 for driving and vibrating weight 11, and the side of support part 6 of other mutually facing two second arms 4 is provided with first sensing part 19 and second sensing part 20 for sensing the strain of second arms 4.

First driving part 17 and second driving part 18 are electrode parts for driving weight 11 of two second arms 4, and first and second driving electrode parts 17a, 17b are disposed oppositely to one second arm 4, and third and fourth driving electrode parts 18a, 18b are disposed oppositely to other second arm 4. These first to fourth driving electrode parts 17a, 17b, 18a, 18b are, as shown in FIG. 2, composed of lower electrode 14 and upper electrode 15 with intervening piezoelectric element 13.

First sensing part 19 and second sensing part 20 are electrode parts for sensing the strain of two second arms 4, and first and second sensing electrode parts 19a, 19b are disposed oppositely to one second arm 4, and third and fourth sensing electrode parts 20a, 20b are disposed oppositely to other second arm 4. These first to fourth sensing electrode parts 19a, 19b, 20a, 20b, like first to fourth driving electrode parts 17a, 17b, 18a, 18b, are, as shown in FIG. 2, composed of lower electrode 14 and upper electrode 15 with intervening piezoelectric element 13.

As shown in FIG. 2, in first to fourth driving electrode parts 17a, 17b, 18a, 18b, and first to fourth sensing electrode parts 19a, 19b, 20a, 20b, lower electrode 14 composed of Pt is formed on second arms 4 made of silicon board by high frequency sputtering, and in the upper part of lower electrode 14, piezoelectric element 13 composed of PZT is formed by high frequency sputtering, and in the upper part of piezoelectric element 13 made of PZT, upper electrode 15 made of Au is formed by vapor deposition.

FIG. 3 is a motion state diagram of this detecting element 1. On the X-axis, Y-axis, and Z-axis mutually crossed orthogonally, when first arm 2 of detecting element 1 is disposed in the X-axis direction, and second arm 4 is disposed in the Y-axis direction, if alternating-current voltage of resonance frequency is applied to first to fourth driving electrode parts 17a, 17b, 18a, 18b, second arm 4 is driven and vibrated starting from second arm 4 on which first driving part 17 and second driving part 18 are disposed, and at the same time, also, weight 11 is driven and vibrated in the opposite directions of second arm 4 (direction D indicated by solid line arrow and broken line arrow). Four second arms 4 and four weights 11 are all united, and driven and vibrated in the opposite directions of second arms 4. The driving and vibrating direction in detecting element 1 is the X-axis direction. In this preferred embodiment, the resonance timing in direction D in FIG. 3 by driving and vibration is deflected in the direction of solid line in all drawings in all four second arms on a certain moment, and is deflected in the direction of broken line in all drawings in all four second arms on other moment.

If an angular rate takes place at this time, for example, counterclockwise (CCW) about the Z-axis, in tune with the driving and vibration of weight 11, a Coriolis force is generated in a direction (direction C indicated by solid line arrow) orthogonal to the driving and vibrating direction to weight 11, and therefore a strain due to the angular rate in the counterclockwise direction of the Z-axis can be generate in second arm 4. The Coriolis direction of detecting element 1 is the Y-axis direction.

At this time, for example, when an angular rate occurs in the Coriolis direction (C-direction) indicated by solid line arrow, in second arms 4 having first to fourth sensing electrode parts 19a, 19b, 20a, 20b, first sensing electrode part 19a and third sensing electrode part 20a sense contraction of second arms 4, and second sensing electrode part 19b and fourth sensing electrode part 20b sense expansion of second arms 4. When Coriolis force is generated in the Coriolis direction indicated by broken line arrow, expansion or contraction is sense in the reverse direction.

Depending on the sensed expansion or contraction, an electric charge is generated in first to fourth sensing electrode parts 19a, 19b, 20a, 20b, and a current flows, and the angular rate is detected on the basis of this output current.

On the other hand, when angular rate occurs clockwise (CW) on the Z-axis, opposite to the case of the angular rate occurring counterclockwise (CCW) on the Z-axis, second arms 4 expand and contract, and this expansion or contraction is sensed by first to fourth sensing electrode parts 19a, 19b, 20a, 20b, and the angular rate is detected similarly.

When an angular rate occurs about the Y-axis, in tune with the driving and vibration of weight 11, a Coriolis force occurs in the direction (Z-axis direction) orthogonal to the driving and vibrating direction to weight 11, and a strain due to angular rate about the Y-axis is generated in second arms 4, and expansion or contraction of second arms 4 can be sensed by first to fourth sensing electrode parts 19a, 19b, 20a, 20b, and the angular rate is detected similarly.

The strain occurring in the event of angular rate about the Z-axis or Y-axis occurs similarly on second arms 4 having first to fourth driving electrode parts 17a, 17b, 18a, 18b, and therefore first to fourth sensing electrode parts 19a, 19b, 20a, 20b may be disposed similarly on second arms 4 having first to fourth driving electrode parts 17a, 17b, 18a, 18b. The sensing operation of first to fourth sensing electrode parts 19a, 19b, 20a, 20b is specifically explained below.

Figure 4:
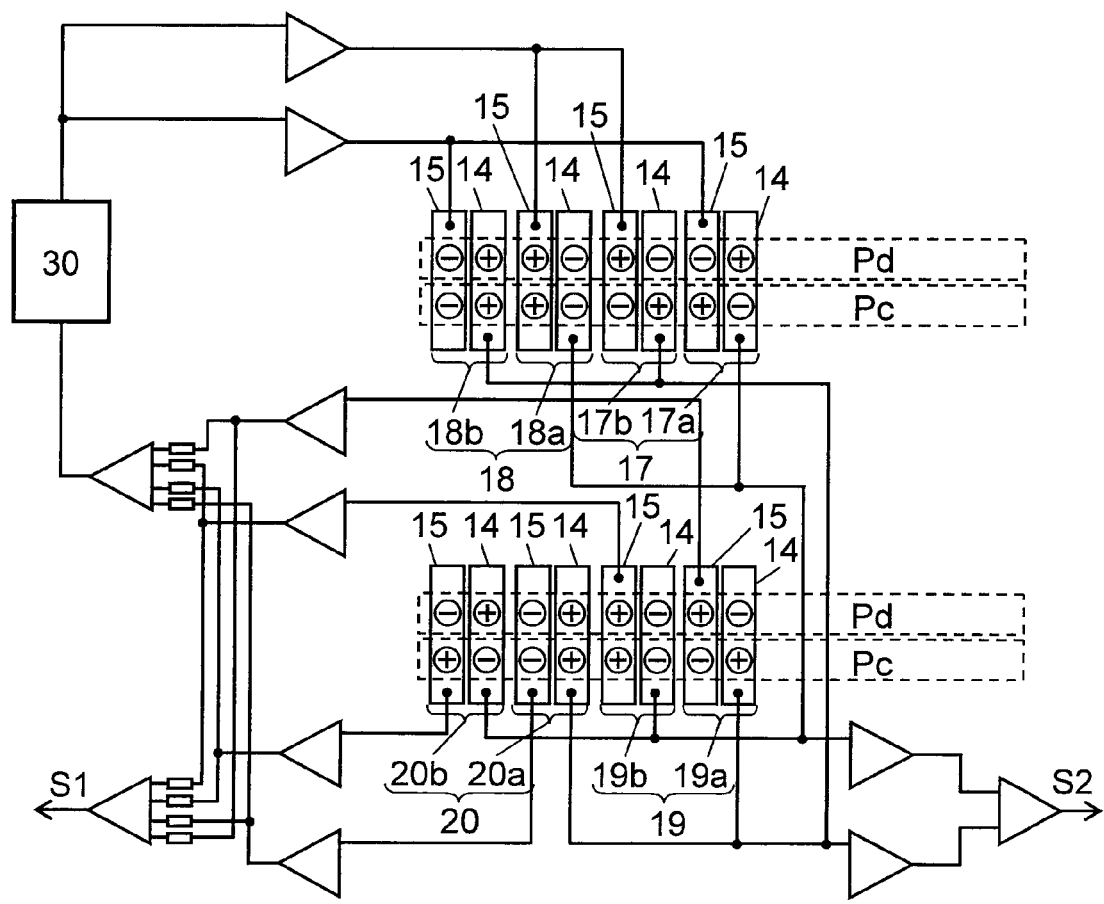
FIG. 4 is a circuit block diagram showing driving process and angular rate detecting process of angular rate sensor in the preferred embodiment of the present invention.

FIG. 4 is a circuit block diagram detecting circuit parts showing driving process and angular rate detecting process of angular rate sensor in the preferred embodiment of the present invention. In FIG. 4, a driving voltage is applied from driving process circuit 30 into first driving part 17 and second driving part 18. In first to fourth driving electrode parts 17a, 17b, 18a, 18b, and first to fourth sensing electrode parts 19a, 19b, 20a, 20b, the polarity of upper electrode 15 and lower electrode 14 in ordinary state free from angular rate is indicated within the broken line surrounding Pd. The polarity of upper electrode 15 and lower electrode 14 in the event of occurrence of angular rate is indicated within the broken line surrounding Pc. The polarity of lower electrode 14 is symmetrical to the polarity of upper electrode 15. In such polarity relation, depending on the alternating-current signal entered in first to fourth driving electrode parts 17a, 17b, 18a, 18b, the polarity of upper electrode 15 and lower electrode 14 is inverted alternately, and the angular rate is detected by the detecting circuit part.

When detecting the angular rate in the event of occurrence of angular rate, the outputs from first and second sensing electrode parts 19a, 19b of first sensing part 19, and third and fourth sensing electrode parts 20a, 20b of second sensing part 20 are processed as follows.

(1) Output values issued from upper electrode 15 of second sensing electrode part 19b and upper electrode 15 of fourth sensing electrode part 20b both in positive polarity are added, and a first sum is obtained.

(2) Output values issued from upper electrode 15 of first sensing electrode part 19a and upper electrode 15 of third sensing electrode part 20a both in negative polarity are added, and a second sum is obtained.

(3) Output values issued from lower electrode 14 of first sensing electrode part 19a and lower electrode 14 of third sensing electrode part 20a both in positive polarity are added, and a third sum is obtained. FIG. 4 shows an example of current adding circuit.

(4) Output values issued from lower electrode 14 of second sensing electrode part 19b and lower electrode 14 of fourth sensing electrode part 20b both in negative polarity are added, and a fourth sum is obtained. FIG. 4 shows an example of current adding circuit.

(5) Differential amplification value S1 of first sum and second sum, and differential amplification value S2 of third sum and fourth sum are detected.

(6) The third sum is summed up with output values issued from lower electrode 14 of second driving electrode part 17b of first driving part 17 and lower electrode 14 of second driving electrode part 18b of second driving part 18. FIG. 4 shows an example of current adding circuit.

(7) The fourth sum is summed up with output values issued from lower electrode 14 of first driving electrode part 17a of first driving part 17 and lower electrode 14 of third driving electrode part 18a. FIG. 4 shows an example of current adding circuit.

In further processing, due to expansion and contraction of second arms 4, the polarity is alternately changed to positive and negative, and when the polarity is opposite, the outputs are processed as follows.

(1) Output values issued from upper electrode 15 of first sensing electrode part 19a and upper electrode 15 of third sensing electrode part 20a both in positive polarity are added, and a first sum is obtained.

(2) Output values issued from upper electrode 15 of second sensing electrode part 19b and upper electrode 15 of fourth sensing electrode part 20b both in negative polarity are added, and a second sum is obtained.

(3) Output values issued from lower electrode 14 of second sensing electrode part 19b and lower electrode 14 of fourth sensing electrode part 20b both in positive polarity are added, and a third sum is obtained.

(4) Output values issued from lower electrode 14 of first sensing electrode part 19a and lower electrode 14 of third sensing electrode part 20a both in negative polarity are added, and a fourth sum is obtained.

(5) Differential amplification value of first sum and second sum, and differential amplification value of third sum and fourth sum are detected.

(6) The third sum is summed up with output values issued from lower electrode 14 of first driving electrode part 17a of first driving part 17 and lower electrode 14 of third driving electrode part 18a.

(7) The fourth sum is summed up with output values issued from lower electrode 14 of second driving electrode part 17b of first driving part 17 and lower electrode 14 of second driving electrode part 18b of second driving part 18.

In the preferred embodiment, the resonance timing in direction D in FIG. 3 by driving and vibration is deflected in the direction of solid line in all drawings in all four second arms on a certain moment, and is deflected in the direction of broken line in all drawings in all four second arms on other moment, but it is also applicable in other driving and vibration. That is, the resonance timing in direction D in FIG. 3 by driving and vibration is deflected in the direction of solid line in all drawings in upper two second arms and in the direction of broken line in lower two second arms on a certain moment, and is deflected in the direction of broken line in all drawings in upper two second arms and in the direction of solid line in lower two second arms on other moment, and in such resonance timing, too, it is possible to sense at high precision same as in the preferred embodiment.

Figure 5:
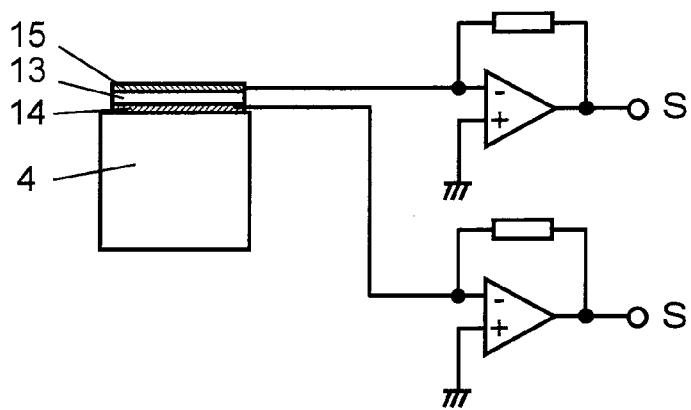
FIG. 5 is a circuit block diagram of angular rate detecting process of angular rate sensor in the preferred embodiment of the present invention.
Figure 6:
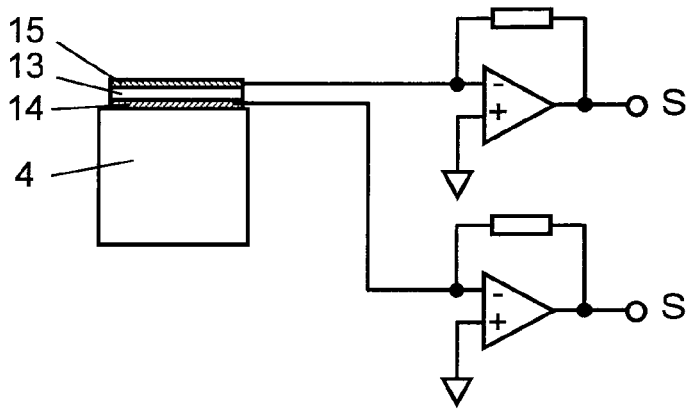
FIG. 6 is a circuit block diagram of angular rate detecting process of angular rate sensor in the preferred embodiment of the present invention.
Figure 7:
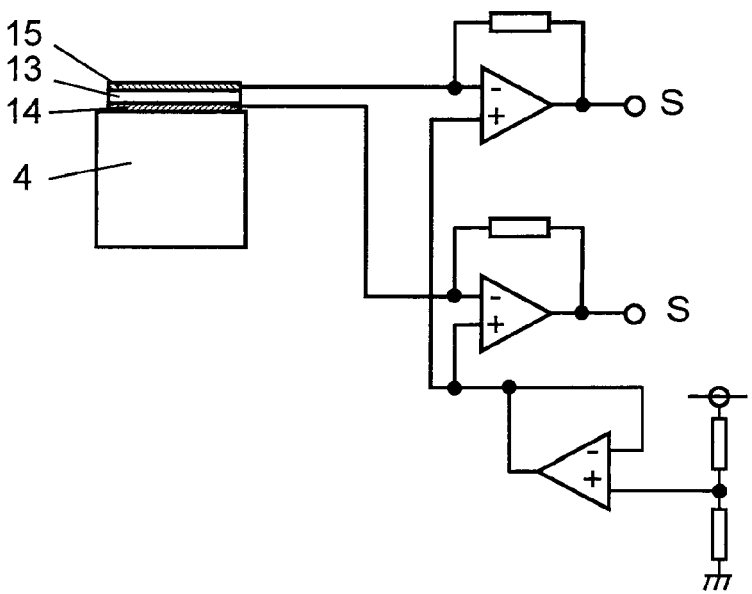
FIG. 7 is a circuit block diagram of angular rate detecting process of angular rate sensor in the preferred embodiment of the present invention.

Detection of angular rate in this configuration is shown in FIG. 5 to FIG. 7, in which on the basis of both output values issued from lower electrode 14 and upper electrode 15 formed together with intervening piezoelectric element 13, signal S can be detected as voltage. FIG. 5 is a circuit configuration example in which the reference voltage of the differential amplifier for determining the voltage output value is grounded, that is, zero volt. FIG. 6 is a circuit configuration example in which the reference voltage of the differential amplifier for determining the voltage output value is a certain reference voltage. FIG. 7 is an example of combination of the actual amplifier for obtaining a certain reference voltage shown in FIG. 6 and a resistance.

Preferred Embodiment 2

Figure 8:
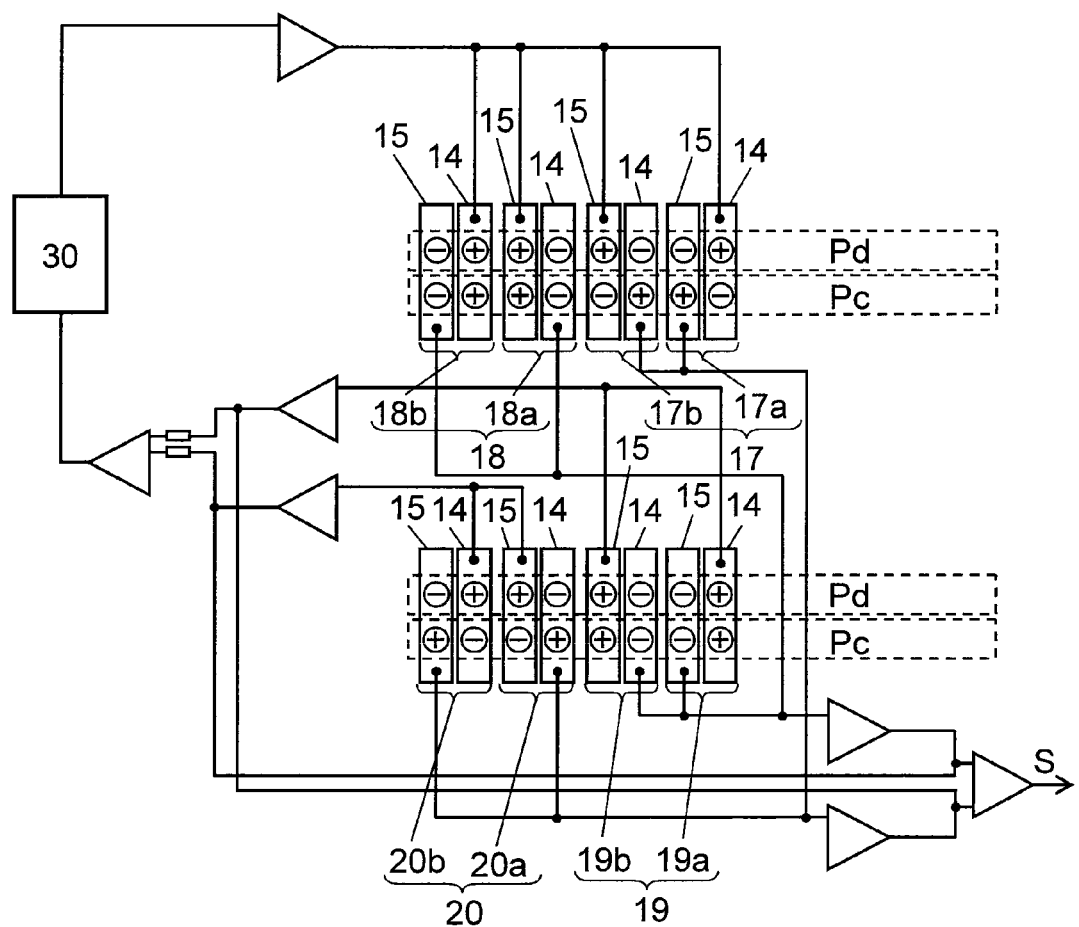
FIG. 8 is a circuit block diagram showing driving process and angular rate detecting process of angular rate sensor in other preferred embodiment of the present invention.

FIG. 8 is other circuit diagram of detecting circuit part of driving process and angular rate detecting process of the angular rate sensor. In FIG. 8, a driving voltage is applied from driving process circuit 30 into first driving part 17 and second driving part 18. In first to fourth driving electrode parts 17a, 17b, 18a, 18b, and first to fourth sensing electrode parts 19a, 19b, 20a, 20b, the polarity of upper electrode 15 and lower electrode 14 in ordinary state free from angular rate is indicated within the broken line surrounding Pd. The polarity of upper electrode 15 and lower electrode 14 in the event of occurrence of angular rate is indicated within the broken line surrounding Pc. In such polarity relation, depending on the alternating-current signal entered in first to fourth driving electrode parts 17a, 17b, 18a, 18b, the polarity of upper electrode 15 and lower electrode 14 is inverted alternately, and the angular rate is detected by the detecting circuit part.

When detecting the angular rate in the event of occurrence of angular rate, the outputs from first and second sensing electrode parts 19a, 19b of first sensing part 19, and third and fourth sensing electrode parts 20a, 20b of second sensing part 20 are processed as follows.

(1) Output values issued from upper electrode 15 of second sensing electrode part 19b and lower electrode 14 of first sensing electrode part 19a both in positive polarity of first sensing part 19 are added, and a first sum is obtained.

(2) Output values issued from upper electrode 15 of first sensing electrode part 19a and lower electrode 14 of second sensing electrode part 19b both in negative polarity of first sensing part 19 are added, and a second sum is obtained.

(3) Output values issued from upper electrode 15 of fourth sensing electrode part 20b and lower electrode 14 of third sensing electrode part 20a both in positive polarity of second sensing part 20 are added, and a third sum is obtained.

(4) Output values issued from upper electrode 15 of third sensing electrode part 20a and lower electrode 14 of fourth sensing electrode part 20b both in negative polarity of second sensing part 20 are added, and a fourth sum is obtained.

(5) Differential amplification value of sum of the first sum and third sum, and the sum of the second sum and fourth sum is detected.

(6) The third sum is summed up with output values issued from upper electrode 15 of first driving electrode part 17a of first driving part 17 and lower electrode 14 of second driving electrode part 17b of first driving part 17.

(7) The second sum is summed up with output values issued from lower electrode 14 of third driving electrode part 18a of second driving part 18 and upper electrode 15 of fourth driving electrode part 18b.

FIG. 8 shows an example of current adding circuit for operating other additions other than (5).

In further processing, due to expansion and contraction of second arms 4, the polarity is alternately changed to positive and negative, and when the polarity is opposite, the outputs are processed as follows.

(1) Output values issued from upper electrode 15 of first sensing electrode part 19a and lower electrode 14 of second sensing electrode part 19b both in positive polarity of first sensing part 19 are added, and a first sum is obtained.

(2) Output values issued from upper electrode 15 of second sensing electrode part 19b and lower electrode 14 of first sensing electrode part 19a both in negative polarity of first sensing part 19 are added, and a second sum is obtained.

(3) Output values issued from upper electrode 15 of third sensing electrode part 20a and lower electrode 14 of fourth sensing electrode part 20b both in positive polarity of second sensing part 20 are added, and a third sum is obtained.

(4) Output values issued from upper electrode 15 of fourth sensing electrode part 20b and lower electrode 14 of third sensing electrode part 20a both in negative polarity of second sensing part 20 are added, and a fourth sum is obtained.

(5) Differential amplification value of sum of the first sum and second sum, and the sum of the second sum and fourth sum is detected.

(6) The fourth sum is summed up with output values issued from upper electrode 15 of first driving electrode part 17a of first driving part 17 and lower electrode 14 of second driving electrode part 17b of first driving part 17.

(7) The first sum is summed up with output values issued from lower electrode 14 of third driving electrode part 18a of second driving part 18 and upper electrode 15 of fourth driving electrode part 18b.

In this configuration, detection of angular rate is detected, shown in FIG. 5 to FIG. 7, on the basis of both output values issued from lower electrode 14 and upper electrode 15 formed together with intervening piezoelectric element 13.

In this configuration, on the basis of the output values issued from upper electrode 15 of first to fourth sensing electrode parts 19a, 19b, 20a, 20b, and the output values issued from lower electrode 14 of first to fourth sensing electrode parts 19a, 19b, 20a, 20b, the angular rate applied to detecting element 1 composed of an elastic element is detected, and if the current values issued from first to fourth sensing electrode parts 19a, 19b, 20a, 20b are very feeble, the detection sensitivity can be enhanced.

As for the sum values, between outputs both in positive polarity, the two outputs are directly connected and entered into the amplifier, and an output of double current value is obtained. Between outputs both in negative polarity, the two outputs are directly, and the output value is doubled. Therefore, when the current direction is the same, the output is doubled by a simple wiring. Such output doubling method may be realized also by not direct wiring method. In the case of the output from positive polarity and the output from negative polarity, only absolute values of the outputs can be added easily by modifying the later circuit.

In the foregoing explanation, the plus and minus sign of the output corresponding to the entered inertial force and the method of doubling the output are mentioned, but unnecessary signal components may be superimposed on the output, and in such a case the unnecessary signal components can be canceled by adding an output reverse in the polarity of the unnecessary signal components and nearly same in the absolute value. When the polarity of unnecessary signal components is the same, they can be similarly canceled by subtracting.

INDUSTRIAL APPLICABILITY

The inertial force sensor of the present invention is capable of enhancing the detection sensitivity if the current flowing out from the sensing electrode part is very feeble, and is hence applicable in various electronic appliances.

The invention claimed is:

1. An inertial force sensor comprising:
a detecting element having a plurality of sensing parts being disposed on an elastic element for sensing the strain of the elastic element, and
detecting circuit parts connected to the sensing parts for detecting the inertial force applied to the elastic element,
wherein the sensing parts have sensing electrode parts each composed of an upper electrode and a lower electrode together with an intervening piezoelectric element, and
the detecting circuit part detects the inertial force applied to the elastic element on the basis of the sum of two output values issued from the upper electrode or lower electrode of the two sensing electrode parts.

2. The inertial force sensor of claim 1, wherein the sum of the two output values is obtained by addition of two output currents issued from the upper electrode or lower electrode of the two sensing electrode parts mutually in positive polarity or mutually in negative polarity.

3. The inertial force sensor of claim 1, further comprising:
a driving part disposed on the elastic element for driving and vibrating the elastic element,
wherein the driving part has a driving electrode part composed of an upper electrode and a lower electrode together with an intervening piezoelectric element, and
the detecting circuit part detects the inertial force applied to the elastic element on the basis of the sum of two output values issued from the upper electrode or lower electrode of the two sensing electrode parts, and the sum of the output value issued from the upper electrode or lower electrode of the driving electrode part.

4. The inertial force sensor of claim 3, wherein the sum of the output values is obtained by addition of output currents issued from the upper electrode or lower electrode of the sensing electrode parts both in positive polarity or both in negative polarity, or from the upper electrode or lower electrode of the driving electrode part.

5. The inertial force sensor of claim 1, wherein the elastic element has a plurality of second arms, one second arm provided with a first sensing part and other second arm with a second sensing part,
the first sensing part and the second sensing part are individually provided with two sensing electrode parts, and of the four sensing electrode parts, on the basis of:
the sum of adding output values issued from two upper electrodes both in positive polarity,
the sum of adding output values issued from two upper electrodes both in negative polarity,
the sum of adding output values issued from two lower electrodes both in positive polarity, and
the sum of adding output values issued from two lower electrodes both in negative polarity,
the inertial force applied to the elastic element is detected.

6. The inertial force sensor of claim 1, wherein the elastic element has a plurality of second arms, one second arm provided with a first sensing part and other second arm with a second sensing part, the first sensing part and the second sensing part are individually provided with two sensing electrode parts, and of the two sensing electrode parts of the first sensing part, on the basis of the sum of adding output values issued from upper electrode and lower electrode both in positive polarity of the first sensing part, the sum of adding output values issued from upper electrode and lower electrode both in negative polarity of the first sensing part, and of the two sensing electrode parts of the second sensing part, on the basis of the sum of adding output values issued from upper electrode and lower electrode both in positive polarity of the second sensing part, and the sum of adding output values issued from upper electrode and lower electrode both in negative polarity of the second sensing part, the inertial force applied to the elastic element is detected.

7. The inertial force sensor of claim 5 or 6, wherein the second arms are arranged in two parallel rows, and the first sensing part is provided in one second arm, and the second sensing part is provided in other second arm.

8. The inertial force sensor of claim 3, wherein the second arms are arranged in two parallel rows on the elastic element, the first sensing part is provided in one second arm, the second sensing part is provided in other second arm, a common support part is provided in the second arms, and relating to the support part of one second arm and other second arm, other second arm is disposed at the opposite side, and further the driving part is provided in other second arm.

* * * * *